(12) United States Patent
Fukui et al.

(10) Patent No.: US 8,159,748 B2
(45) Date of Patent: *Apr. 17, 2012

(54) OPTICAL ARTICLE AND MANUFACTURING METHOD THEREOF

(75) Inventors: Tomohito Fukui, Minowa-machi (JP); Keiichi Suzuki, Okaya (JP)

(73) Assignee: Seiko Epson Corporation, Tokyo (JP)

(*) Notice: Subject to any disclaimer, the term of this patent is extended or adjusted under 35 U.S.C. 154(b) by 613 days.

This patent is subject to a terminal disclaimer.

(21) Appl. No.: 11/968,761

(22) Filed: Jan. 3, 2008

(65) Prior Publication Data

US 2008/0174876 A1    Jul. 24, 2008

(30) Foreign Application Priority Data

Jan. 23, 2007  (JP) ................................. 2007-012786

(51) Int. Cl.
 *G02B 1/10*  (2006.01)
(52) U.S. Cl. ......... 359/582; 359/580; 359/586; 359/587
(58) Field of Classification Search .................. 359/580, 359/582, 586, 587, 588; 438/636

See application file for complete search history.

(56) References Cited

U.S. PATENT DOCUMENTS

| | | | |
|---|---|---|---|
| 4,416,952 A | 11/1983 | Nishizawa et al. | |
| 6,268,282 B1 * | 7/2001 | Sandhu et al. | 438/636 |
| 6,277,507 B1 | 8/2001 | Anzaki et al. | |
| 6,664,177 B1 | 12/2003 | Lin et al. | |
| 6,764,579 B2 * | 7/2004 | Veerasamy et al. | 204/192.11 |
| 7,476,415 B2 * | 1/2009 | Jiang | 427/162 |
| 7,587,810 B2 * | 9/2009 | Le | 29/603.15 |
| 7,880,966 B2 * | 2/2011 | Suzuki | 359/581 |
| 2001/0016262 A1 | 8/2001 | Toyoshima et al. | |
| 2005/0037240 A1 | 2/2005 | Haoto et al. | |

FOREIGN PATENT DOCUMENTS

| | | |
|---|---|---|
| EP | 1 816 489 A2 | 8/2007 |
| JP | 10-048402 A | 2/1998 |
| JP | 10-160902 A | 6/1998 |
| JP | 2001-192821 A | 7/2001 |
| JP | 2003-329803 A | 11/2003 |
| JP | 2005-133131 A | 5/2005 |

* cited by examiner

*Primary Examiner* — Audrey Y Chang
(74) *Attorney, Agent, or Firm* — Sughrue Mion, PLLC

(57) ABSTRACT

An optical article includes: an optical base; and a layer that is provided on the optical base and contains $SiO_2$ as a main component, the layer being a silicon-nitride-containing silicon oxide layer containing $Si_sO_tNu$ ($s>0$, $T \geq 0$, $u>0$).

1 Claim, 3 Drawing Sheets

OPTICAL ARTICLE AND MANUFACTURING METHOD THEREOF

The entire disclosure of Japanese Patent Application No. 2007-012786, filed Jan. 23, 2007, is expressly incorporated by reference herein.

BACKGROUND

1. Technical Field

The present invention relates to an optical article containing a layer of which main component is $SiO_2$ (silicon dioxide) and a manufacturing method thereof.

2. Related Art

Generally, on a surface of an optical article such as a spectacle lens, a hard coat layer to prevent abrasion, an anti-reflection layer to prevent ghost and flicker, an anti-dirt layer to provide water- and oil-repellent effects and the like are provided.

The anti-reflection layer is generally structured by a plurality of layers formed by alternately laminating materials having different refractive indices on a surface of the hard coat layer. Regarding materials to form such a multilayered anti-reflection layer, JP-A-2003-329803 discloses a technology in which $SiO_2$ is used as a low refractive index layer while $ZrO_2$ (zirconium oxide), $TiO_2$ (titanium oxide), $Nb_2O_5$ (niobium oxide) or the like is used as a high refractive index layer.

However, since the hardness of $SiO_2$ that is used as the low refractive index layer of the anti-reflection layer is lower than the hardness of $ZrO_2$, abrasion resistance of the optical article formed by a combination of the disclosed materials is low. Accordingly, the optical article may be abraded due to rough handling by a user or carelessness of the user. Further, the abrasion may cause a film detachment.

SUMMARY

An advantage of some aspects of the invention is to provide an optical article having excellent abrasion resistance and a manufacturing method thereof.

An optical article according to an aspect of the invention includes: an optical base; and a layer that is provided on the optical base and contains $SiO_2$ as a main component. The layer is a silicon-nitride-containing silicon oxide layer containing $Si_sO_tN_u$ ($s>0$, $T\geqq0$, $u>0$).

Although $Si_sO_tN_u$ may be arbitrarily selected within the ranges: $s>0$; $t\geqq0$; and $u>0$, $Si_3N_4$ is the most preferably employed in terms of its stability. $Si_2ON_2$ and $Si_3O_3N_4$ can be also employed.

With the arrangement, since the layer of which main component is $SiO_2$ contains a nitride represented by $Si_sO_tN_u$, the hardness of the optical article increases. Accordingly, abrasion resistance of the optical article can be improved, so that abrasion on a surface of the optical article or film-detachment can be prevented.

The optical article may preferably further include: an anti-reflection layer constructed by a plurality of layers provided on the optical base. At least one of the plurality of layers may preferably be the silicon-nitride-containing silicon oxide layer.

With the arrangement, at least one of low refractive index layers is a silicon-nitride-containing silicon oxide layer. As a component used in a high refractive index layer, $ZrO_2$ (zirconium oxide) or $TiO_2$ (titanium oxide) can be exemplified. The anti-reflection layer is formed by alternately laminating the low and high refractive index layers. An outermost layer and an innermost layer are preferably the low refractive index layers containing $SiO_2$ as a main component but may be silicon oxide layers containing silicon nitride. Accordingly, adhesion of the outermost layer to an anti-dirt layer or an anti-fog layer and adhesion of the innermost layer to a hard coat layer relative to another layer can be excellent. The optical article is formed in a three-, five- or seven-layer structure in which the high refractive index layer is interposed. In these layered structures, it is only required that at least one of the low refractive index layers is the silicon-nitride-containing silicon oxide layer. However, all the low refractive index layers are preferably the silicon-nitride-containing silicon oxide layers, where the hardness can be further increased to improve the abrasion resistance.

As described above, since the low refractive index layers containing a nitride represented by $Si_sO_tN_u$ and the high refractive index layers are alternately laminated, sufficient anti-reflection property and the abrasion resistance can be obtained.

In the optical article, the optical base may preferably be a spectacle lens base.

With the arrangement, since the anti-reflection layer structured by the aforesaid low and high refractive index layers is formed on a spectacle lens base, the spectacle lens can be simultaneously provided with the anti-reflection property and the abrasion resistance.

A method for manufacturing the optical article according to an aspect of the invention includes: introducing nitrogen-containing gas when the silicon-nitride-containing silicon oxide layer is formed on the optical base by a deposition.

With the arrangement, when the aforesaid silicon-nitride-containing silicon oxide layer is deposited on an optical base, a gas that contains $N_2$ (nitrogen) as well as $SiO_2$ (a main component of the low refractive index layer) is introduced. Accordingly, $SiO_2$ reacts with $N_2$ to generate a nitride represented by $Si_sO_tN_u$, which can be directly deposited on an optical base surface.

In the method for manufacturing the optical article, the deposition may preferably be an ion-assisted deposition.

With the arrangement, since the ion-assisted method is an existing deposition technique, the deposition can be easily conducted only by changing a gas that is a raw material. Additionally, since ions are accelerated when being irradiated on the base, energy becomes high, which promotes reaction between $SiO_2$ and nitrogen.

Hence, the layer can be formed using the existing technique, so that the low refractive index layer containing a nitride represented by $Si_sO_tN_u$ can be easily deposited without requiring additional costs or steps.

Ion plating method can be also used in view of ionization of a material to be deposited.

In the method for manufacturing the optical article, the nitrogen-containing gas may preferably further contain at least one of argon and oxygen.

With the arrangement, since the gas that is introduced to form the low refractive index layer contains oxygen or argon as well as nitrogen, the oxygen or the argon is ionized, thereby promoting ionization of the nitrogen. Further, the introduced oxygen or argon further activates $SiO_2$, so that reaction between $SiO_2$ and nitrogen can be promoted.

BRIEF DESCRIPTION OF THE DRAWINGS

The invention will be described with reference to the accompanying drawings, wherein like numbers reference like elements.

DESCRIPTION OF EXEMPLARY EMBODIMENT(S)

An exemplary embodiment of the invention will be described below with reference to the drawings. The exemplary embodiment is merely an example, in which a spectacle lens is employed as an optical article.

Figure 1:
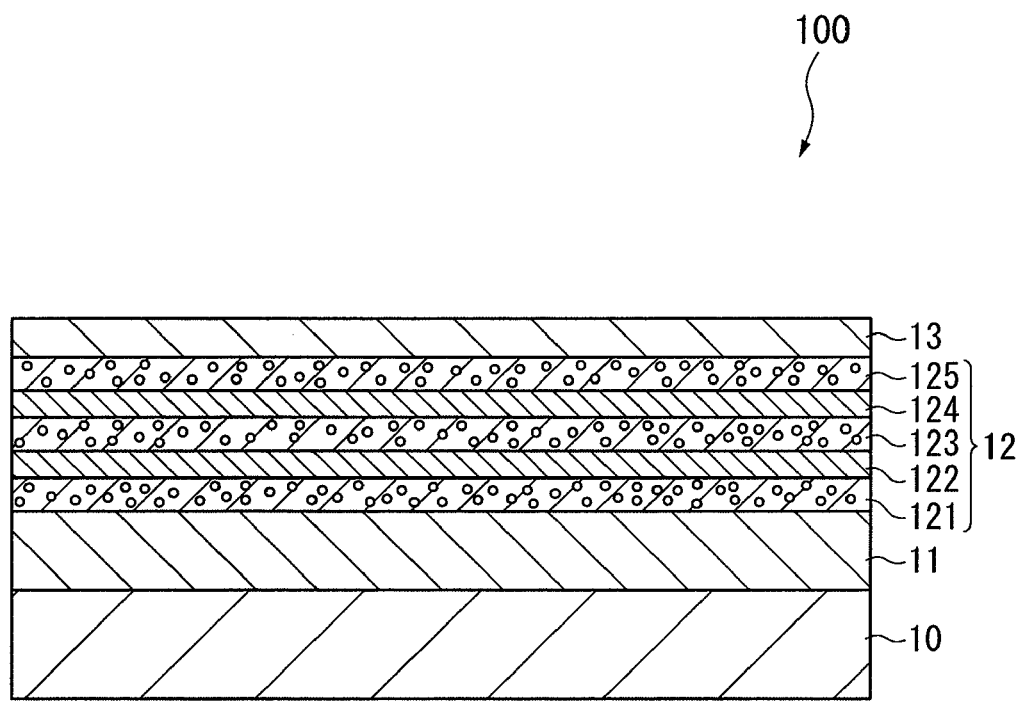
FIG. 1 is a cross section of a spectacle lens according to an exemplary embodiment of the invention.

FIG. 1 is a cross section of a spectacle lens 100 of the exemplary embodiment.

1 Arrangement of Spectacle Lens 100

In the spectacle lens 100, a hard coat layer 11, an anti-reflection layer 12 and an anti-dirt layer 13 are laminated in this order from an inner side to an outer side on a surface of a lens base 10.

In the anti-reflection layer 12, a first layer that is a low refractive index layer and a second layer that is a high refractive index layer are alternately laminated. Specifically, the anti-reflection layer 12 is structured by five layers: the first layer 121; the second layer; a third layer 123; a fourth layer 124; and a fifth layer 125 in this order from the hard coat layer 11. The third layer 123 and the fifth layer 125 are the low refractive index layers. The fourth layer 124 is the high refractive index layer.

2. Lens Base 10

The lens base 10 provides basic properties of a spectacle lens (or an optical article) such as refractive index, mechanical strength and transmittance.

Although a material of the lens base 10 is not particularly limited, (metha)acrylic resin; styrene resin; polycarbonate resin; allyl resin; allyl carbonate resin such as diethylene glycol bis allyl carbonate resin (CR-39); vinyl resin; polyester resin; polyether resin; urethane resin obtained in reaction between isocyanate compound and hydroxy compound such as diethylene glycol; thiourethane resin obtained in reaction between isocyanate compound and polythiol compound; and transparent plastic resin obtained by curing polymerizable composition containing (thio)epoxy compound having at least one disulfide bond in molecule can be used.

3. Hard Coat Layer 11

The hard coat layer 11 may be arbitrarily selected as long as the hard coat layer 11 can exhibit an inherent function of improving abrasion resistance. For instance, although a hard coat film made of: melamine-based resin; silicone-based resin; urethane-based resin; acrylic-based resin; or the like can be exemplified, a hard coat film made of silicone-based resin is the most preferable. The hard coat film can be formed, for example, by applying and curing a coating composition made of a metal-oxide particulate and a silane compound. The coating composition may contain components such as colloidal silica and polyfunctional epoxy compound.

Further, the hard coat layer 11 may contain conventionally-known additives. The additives include: a leveling agent to improve coating property; an ultraviolet absorber and an oxidant inhibitor to improve antiweatherability; a dye; and a pigment.

In order to form the hard coat layer 11, a composition to form the hard coat layer 11 may be applied by dipping method, spinner method, spray method or flow method and then heated and dried at a temperature from 40 to 200 degrees Celsius for several hours.

4. Anti-Reflection Layer 12

The anti-reflection layer 12 will be described below.

The anti-reflection layer 12 has optical functions such as anti-reflection and filtering as well as abrasion resistance. Note that reflectivity of the anti-reflection layer 12 is equal to or less than 3% in a visible light region (380 to 700 nm).

The anti-reflection layer 12 is structured by the five layers, in which the low refractive index layers and high refractive index layers are alternately laminated, i.e. the first layer 121, the second layer 122, the third layer 123, the fourth layer 124 and the fifth layer 125.

The first, third and fifth layers 121, 123 and 125 contain $SiO_2$ (silicon dioxide) as a main component. More specifically, the first, third and fifth layers 121, 123 and 125 are low refractive index layers that are made of silicon-nitride-containing silicon oxide containing a nitride represented by $Si_sO_tN_u$ (s>0, T≧0, u>0). The second and fourth layers 122 and 124 are the high refractive index layers that are made of $ZrO_2$ (zirconium oxide).

Note that since the hardness of $Si_sO_tN_u$ becomes higher in accordance with increase in amount of nitrogen, $Si_3N_4$ that has relatively excellent stability is the most preferable as the nitride. However, too much $Si_sO_tN_u$ contained in the low refractive index layers may cause discoloration or large change in refractive index. Hence, it is preferable that $Si_sO_tN_u$ is contained in a reasonable amount that does not change the refractive index.

5. Anti-Dirt Layer 13

The anti-dirt layer 13 is formed on a surface of the anti-reflection layer 12.

The anti-dirt layer 13 exhibits anti-dirt property (water- and oil-repellency) such that a spectacle lens surface is not soiled by hands, sweat, cosmetics and the like when the lens is used.

The anti-dirt layer 13 can be formed using fluorine-based fluoroalkylsilane and the like. As an applying method of the anti-dirt layer 13, known methods such as dipping method, spinner method, spray method and flow method can be used. In the exemplary embodiment, the anti-dirt layer 13 is formed by deposition using a below-described deposition apparatus 200.

6. Arrangement of Deposition Apparatus 200

The deposition apparatus 200 that forms the hard coat layer 11, the anti-reflection layer 12 and the anti-dirt layer 13 on the lens base 10 will be described below.

Figure 2:
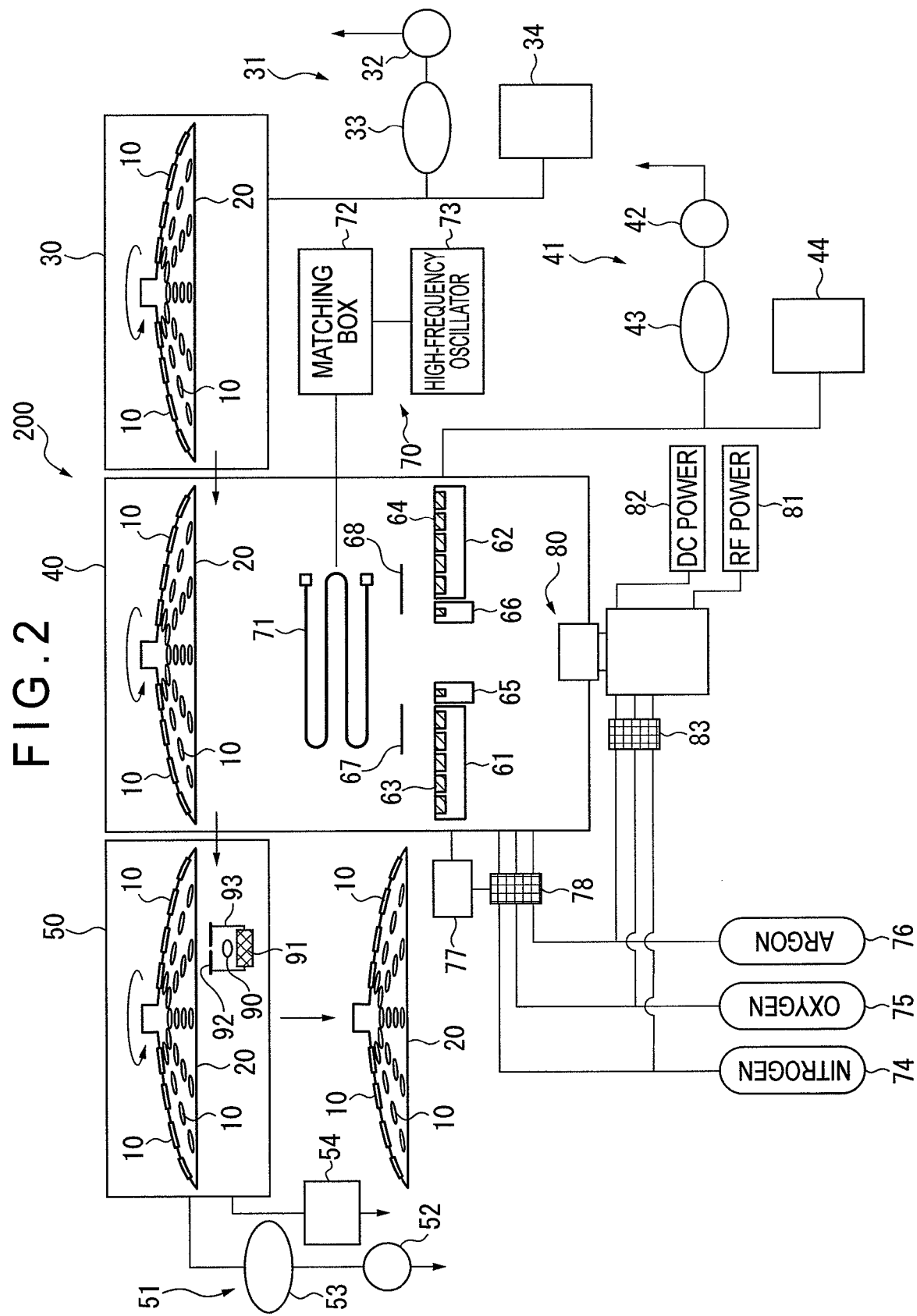
FIG. 2 schematically shows a deposition apparatus according to the exemplary embodiment of the invention.

FIG. 2 schematically shows the deposition apparatus 200 for manufacturing the spectacle lens 1. The deposition apparatus 200 forms the anti-reflection layer 12 by alternately laminating the low refractive index layers and the high refractive index layers on the hard coat layer 11 formed on the lens base 10 and then forms the anti-dirt layer 13 on the anti-reflection layer 12.

Arrangement of the deposition apparatus 200 will be described below in detail.

In FIG. 2, a plurality of the lens base 10 are supported by a support unit 20. The support unit 20 is moved for each process in the deposition apparatus 200 to conduct surface-treatment on the lens bases 10. The support unit 20 is rotated by a rotating mechanism (not shown) such that the lens bases 10 can be uniformly surface-treated.

The deposition apparatus 200 includes three chambers 30, 40 and 50 in which the support unit 20 can move. The chambers 30, 40 and 50 are coupled with each other, so that the support unit 20 can pass therethough while holding the lens bases 10. The chambers can be sealed independently from each other by a shutter (not shown) provided between the chambers. Internal pressures in the chambers are respectively controlled by vacuum generators 31, 41 and 51.

The chamber 30 is an entrance chamber (a gate chamber). The support unit 20 is introduced from the outside into the chamber 30 to be heated at a certain pressure for a certain period of time. In the chamber 30, gas adsorbed on the lens bases 10 and the support unit 20 is removed (i.e., degassing). The vacuum generator 31 of the chamber 30 includes a rotary pump 32, a roots pump 33 and a cryopump 34.

In the chamber 40, a thin film is formed by vacuum deposition or surface-treatment is conducted utilizing plasma and the like. Similarly to the vacuum generator 31 of the chamber 30, the vacuum generator 41 of the chamber 40 includes a rotary pump 42, a roots pump 43 and a cryopump 44.

Inside the chamber 40, a pair of vapor sources 61 and 62 are provided to efficiently form the anti-reflection layer 12 by combining deposition materials having different refractive indices. Electron guns 65, 66 are provided in pairs to respectively vapor deposition materials 63 and 64 which are set in the vapor sources 61 and 62. Shutters 67 and 68 are also provided in pairs to adjust deposition amounts.

As an example of the deposition materials having different refractive indices, $SiO_2$ (silicon dioxide) that has low refractive index may be provided in the vapor source 61 while $TiO_2$ (titanium oxide) or $ZrO_2$ (zirconium oxide) which has high refractive index may be provided in the vapor source 62.

The chamber 40 is provided with a high-frequency plasma generator 70 to conduct plasma treatment. The high-frequency plasma generator 70 includes: an RF coil 71 provided inside the chamber, a matching box 72 connected with the RF coil 71 and provided outside the chamber; and a high-frequency oscillator 73.

Nitrogen 74, oxygen 75 and argon 76, which are gasses used in deposition treatment, are introduced at a predetermined pressure controlled by an automatic pressure controller 77 and at a predetermined flow rate controlled by a mass flow controller 78.

Further, the chamber 40 is provided with an ion gun 80 to conduct ion-assisted deposition and surface-treatment. The ion gun 80 is connected with: an RF power source 81 that processes an introduced gas into plasma to generate a positive ion; and a DC power source 82 that accelerates the positive ion.

The nitrogen 74, the oxygen 75 and the argon 76 that are used for the ion gun 80 are introduced at flow rates controlled by the mass flow controller 83.

The chamber 50 forms the anti-dirt layer 13 by depositing a deposition material that is an organic compound. Inside the chamber 50, a vapor source 90 containing an organic compound; a heating unit 91; and a corrector plate 92 are provided. The chamber 50 is maintained at a suitable pressure by the vacuum generator 51 that includes a rotary pump 52, a roots pump 53 and a turbo molecular pump 54.

7. Manufacturing Method of Spectacle Lens 100

A method for manufacturing the spectacle lens 100 by forming the hard coat layer 11, the anti-reflection layer 12 and the anti-dirt layer 13 on the lens base 10 will be described.

Initially, the hard coat layer 11 is formed on a surface of the lens base 10. The hard coat layer 11 can be obtained by, for instance, curing sol-gel having an inorganic particulate. In the curing method, the inorganic particulate can be selected in accordance with the refractive index of the lens base 10, so that reflection on an interface of the lens base 10 and the hard coat layer 11 can be reduced. The hard coat layer 11 is provided on one of or both of the surfaces of the lens base 10 as necessary. In this exemplary embodiment, the hard coat layer 11 is provided on both surfaces.

Subsequently, the lens bases 10 held by the support unit 20 are introduced to the chamber 30 and degassed therein. Then, the support unit 20 is introduced to the chamber 40, where the anti-reflection layer 12 is formed on a surface of the hard coat layer 11.

Figure 3:
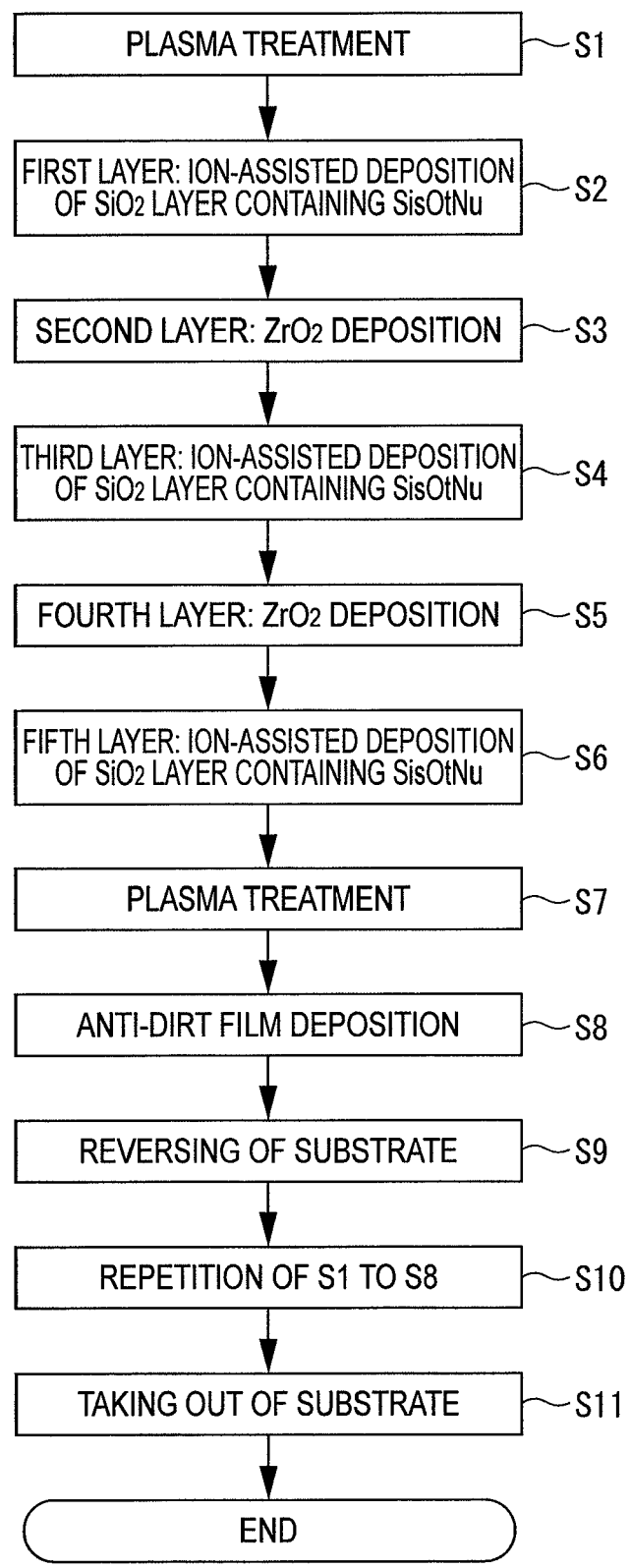
FIG. 3 is a flowchart showing a forming process of an anti-reflection layer according to the exemplary embodiment of the invention.

FIG. 3 shows a flow to form the anti-reflection layer 12.

As shown in FIG. 3, the lens base 10 is plasma-treated in a plasma treatment step (S1) and the low refractive index layer 121 is formed on the plasma-treated lens base 10 (S2).

In the step to form the low refractive index layer 121, in order to deposit $SiO_2$, the nitrogen 74 is introduced to the ion gun 80 at a certain flow rate controlled by the mass flow controller 83. The introduced gas is processed to plasma in the ion gun 80. The plasma is high-frequency plasma. A frequency of the RF power source 81 is normally 13.56 MHZ. The generated positive ion is drawn by an acceleration electrode on which a voltage is applied by the DC power source 82, the positive ion then being irradiated on the lens base surface simultaneously with the deposition of $SiO_2$. Note that, in order to prevent a puncture on the lens base 10 which may cause an abnormal electrical discharge, a built-in neutralizer supplies an electron for neutralization. In S2, the nitride represented by $Si_sO_tN_u$ is generated in the $SiO_2$ layer. It is only necessary that the introduced gas include nitrogen. For instance, nitrogen; a mixed gas of nitrogen and oxygen; a mixed gas of nitrogen and argon; and a mixed gas of nitrogen and oxygen can be exemplified. It is preferably to conduct S2 with an acceleration voltage from 300 to 1000V; an acceleration current from 100 to 500 mA; and a gas flow rate from 10 to 40 sccm.

Subsequently, $ZrO_2$ is deposited to form the high refractive index layer 122 (S3). Further, the low refractive index layer 123 is formed (S4) as in S2. $ZrO_2$ is deposited to form the high refractive index layer 124 (S5) as in S3. Lastly, the low refractive index layer 125 is formed (S6) as in S2. Thus, the anti-reflection layer 12 is formed, in which a plurality of layers (the high refractive index layers and the low refractive index layers) are alternately laminated on each other.

It is only necessary to conduct the ion-assisted deposition in at least one of the low refractive index layers 121, 123 and 125. However, it is the most effective that the ion-assisted deposition is conducted in all of the low refractive index layers.

Subsequent to the plasma treatment (S7), the support unit 20 is introduced to the chamber 50, where the anti-dirt layer 13 is formed (S8). The anti-dirt layer 13 can be obtained using an organic compound that contains fluorine having water- and oil-repellency for the vapor source 90. After the anti-dirt layer 13 is formed, pressure in the chamber 50 is gradually returned to atmospheric pressure. Then, the lens bases 10 are taken out therefrom while being held on the support unit 20.

Note that an anti-fog layer can be formed as well as the anti-dirt layer. The anti-fog layer can be obtained using an organic compound having hydrophilic radical for the vapor source 90.

Subsequently, the lens base 10 is reversed (S9) and re-set on the support unit 20. The same treatments from S1 to S8 are conducted on the opposite surface of the lens base 10 (S10). Accordingly, the anti-reflection layer 12 and the anti-dirt layer 13 are formed on both surfaces of the lens base 10.

After the lens base 10, on which the hard coat layers 11, the anti-reflection layers 12 and the anti-dirt layers 13 are formed, is taken out from the chamber 50 (S1), the lens base 10 is introduced in a container of which temperature and humidity are constant (not shown). Therein, the lens base 10 is annealed in an atmosphere suitably humidified at a suitable temperature. Alternatively, the lens base 10 is left indoors for a predetermined period of time for aging. Subsequently, when it is necessary to adjust the thickness of the anti-dirt layer 13, a surplus portion is removed by, for example, wiping.

The above-described exemplary embodiment provides following effects and advantages.

1 In the exemplary embodiment, since a nitride represented by $Si_sO_tN_u$ is contained in the low refractive index layer of the anti-reflection layer 12 which contains $SiO_2$ as a main component, the hardness of the anti-reflection layer 12 is increased. Accordingly, abrasion resistance of an optical article provided with the $Si_sO_tN_u$ containing layer can be improved. In other words, the spectacle lens 100 that is unlikely to be abraded or of which film is unlikely to be detached can be provided.

In addition, in the exemplary embodiment, since all of the low refractive index layers 121, 123 and 125 contain a nitride represented by $Si_sO_tN_u$, greater effects can be obtained.

2 Since a nitride represented by $Si_sO_tN_u$ is provided as a part of $SiO_2$, the properties of the anti-reflection layer are scarcely affected.

Hence, it is not necessary to change the existing film design of the anti-reflection layer 12, so that the abrasion resistance of the spectacle lens 100 can be improved without any additional costs and steps.

3 In the manufacturing method of the spectacle lens 100 of the exemplary embodiment, since nitrogen ions accelerated by an ion-assisted method are irradiated on the lens base 10, $SiO_2$ can easily reacts with nitrogen.

4 In the exemplary embodiment, since oxygen or argon is contained as well as nitrogen, the oxygen or the argon is ionized, which promotes ionization of the nitrogen. Further, since oxygen or argon is introduced, $SiO_2$ can be further activated, thereby promoting the reaction between $SiO_2$ and nitrogen.

5 As described above, although it is only necessary to introduce of a gas containing nitrogen as a main component, the low refractive index layer that contains a nitride represented by $Si_sO_tN_u$ can be easily formed using the existing technology without increasing costs and production steps.

Note that the invention is not limited to the exemplary embodiment but encompasses modifications and improvements as long as an object and an advantage of the invention can be attained.

For example, the anti-reflection layer 12 of the exemplary embodiment has a five-layer structure (formed by the first to fifth layers). However, since it is only necessary that a top layer and a bottom layer of the anti-reflection layer 12 are made of $SiO_2$ (silicon dioxide), the anti-reflection layer 12 may have a three-layer or seven-layer structure in which the low refractive index layers and the high refractive index layers are alternately laminated or in which the low and high refractive index layers are laminated with another layer interposed.

The optical article is not limited to a spectacle lens but may be a telescope lens and the like.

Further, in the exemplary embodiment, one side of a lens is initially treated in all of the chambers and then the opposite side is similarly treated. However, layers may be formed on both sides of a lens base in one chamber and then moved to the next chamber.

EXAMPLES

Spectacle lenses were produced by methods shown in the following examples and comparisons, where abrasion resistance tests and optical property evaluations of the spectacle lenses were conducted.

Example 1

As the lens base 10, a spectacle plastic lens ("Seiko Super Sovereign" manufactured by SEIKO EPSON CORPORATION) was used. The hard coat layer 11 was formed on the lens base 10 in advance. The plastic lens was set on the support unit 20 with a concaved surface directed downward.

After being degassed in the chamber 30, the plastic lens was moved to the chamber 40, to which pure argon gas was introduced while a pressure therein was controlled at $4.0 \times 10^{-2}$ Pa to generate plasma by a high-frequency plasma generator. The plasma was generated at 13.56 MHz and 400 W for one minute. Accordingly, the surface of the lens base 10, on which the hard coat layer 11 was formed, was cleaned, thereby improving adhesion between the hard coat layer 11 and the anti-reflection layer 12.

Next, while nitrogen gas (15 sccm) and argon gas (5 sccm) were introduced at the acceleration voltage of 500V and the acceleration current of 150 mA, a $SiO_2$ layer containing a nitride represented by $Si_sO_tN_u$ was formed by ion-assisted deposition.

Subsequently, a $ZrO_2$ layer was formed by vacuum deposition.

Then, these $SiO_2$ and $ZrO_2$ layers were alternately laminated such that a low refractive index layer containing $SiO_2$ as a main component is provided as an outermost layer, thereby forming the anti-reflection layer 12.

Next, pure oxygen gas was introduced into the chamber 40 at a controlled pressure of $4.0 \times 10^{-2}$ Pa to generate plasma by a high-frequency plasma generator. The plasma was generated at 13.56 MHz and 400 W for two minutes. Accordingly, a surface of the anti-reflection layer 12 was activated to promote chemical reaction between the anti-reflection layer 12 and the anti-dirt layer 13 subsequently laminated on the anti-reflection layer 12.

The lens base 10 was moved to the chamber 50, in which the anti-dirt layer 13 was formed. As a deposition source, fluorine-containing organosilicon compound ("KY-130" manufactured by Shin-Etsu Chemical Co., Ltd.) was diluted with fluorine-based solvent ("Novec HFE-7200" manufactured by Sumitomo 3M Limited) to prepare 3% solid content solution. A pellet made of porous ceramics was impregnated with one gram of the solution and dried. Regarding a deposition method, a halogen lamp was used as a heater to heat the pellet (the deposition source) to 600 degrees Celsius, vaporing the fluorine-containing organosilicon compound. Deposition time was three minutes. After the anti-dirt layer 13 was formed, the support unit 20 was taken out from the chamber 50. The lens base 10 was reversed and placed on the support unit 20 with a convex surface directed downward to conduct the same treatments as described above. Thus, the anti-dirt layer 13 was formed on both sides of the lens.

Example 2

A $SiO_2$ layer containing a nitride represented by $Si_sO_tN_u$ was deposited by ion-assisted deposition under the conditions that: the acceleration voltage was 300V; the acceleration current was 100 mA; and the other conditions were the same as in Example 1.

Example 3

A $SiO_2$ layer containing a nitride represented by $Si_sO_tN_u$ was deposited by ion-assisted deposition under the conditions that: the acceleration voltage was 1000V; the acceleration current was 500 mA; and the other conditions were the same as in Example 1.

Comparison 1

A spectacle lens was produced as in Example 1 except that a $SiO_2$ layer was deposited without ion-assistance. In other words, a pure $SiO_2$ layer was formed as a low refractive index layer.

Comparison 2

A spectacle lens was produced as in Example 1 except that a $SiO_2$ layer containing a nitride represented by $Si_sO_tN_u$ was deposited by ion-assisted deposition under the conditions that: the acceleration voltage was 200V; and the acceleration current was 80 mA.

Comparison 3

A spectacle lens was produced as in Example 1 except that a $SiO_2$ layer containing a nitride represented by $Si_sO_tN_u$ was deposited by ion-assisted deposition under the conditions that: the acceleration voltage was 1200V; and the acceleration current was 600 mA.

Spectacle lenses obtained in Examples 1 to 3 and Comparisons 1 to 3 were evaluated by conducting the following test.

Abrasion Resistance Test

Steel wool (#0000) was wound around a tool, which was placed on a spectacle lens surface and reciprocated thereon fifty times while a load of two kilograms is applied. Abraded degree of each spectacle lens was compared with that of a standard sample to evaluate the abrasion in four ranks: A, B, C and D.

Evaluation of Optical Properties

Visible light transmittance was measured to evaluate anti-reflection property. When a value of the visible light transmittance is large, the anti-reflection of the spectacle lens is great.

Evaluation results are shown below.

TABLE 1

|  | Abrasion Resistance | Optical Property (%) | Overall Evaluation |
| --- | --- | --- | --- |
| Example 1 | A | 98.7 | A |
| Example 2 | A | 98.6 | A |

TABLE 1-continued

|  | Abrasion Resistance | Optical Property (%) | Overall Evaluation |
| --- | --- | --- | --- |
| Example 3 | A | 98.5 | A |
| Comparison 1 | D | 98.8 | C |
| Comparison 2 | B | 98.8 | B |
| Comparison 3 | A | 95.0 | C |

In each of Examples 1 to 3, since a nitride represented by $Si_sO_tN_u$ was contained in the $SiO_2$ layer, abrasion resistance of the spectacle lens was excellent. Further, each spectacle lens showed a numerical value equivalent to that of an existing spectacle lens (Comparison 1), thereby proving that the optical property was not impaired by the nitride.

Comparison 1 was the existing spectacle lens of which abrasion resistance was poor.

In Comparisons 2 and 3, since the conditions for ion-assisted deposition were not proper, results were not excellent. In Comparison 2, since the acceleration voltage and the acceleration current were too low, nitriding was insufficient, so that abrasion resistance was not sufficient. In Comparison 3, since the acceleration voltage and the acceleration current were too high, the amount of the nitride becomes excessive, thereby considerably deteriorating the optical property. In this case, it is needed to renew the film design, which is not preferable. As described above, the amount of the nitride contained in $SiO_2$ layer can be adjusted only by changing the conditions for ion-assisted deposition.

The invention can be used for an optical article such as a spectacle lens.

What is claimed is:

1. An optical article, comprising:
    an optical base for a spectacle lens base; and
    an anti-reflection layer constructed by a plurality of layers provided on the optical base, wherein:
        at least one layer of the plurality of layers contains $SiO_2$ as a main component, the at least one layer also containing $Si_sO_tN_u$ ($s>0$, $t\geqq0$, $u>0$), such that the at least one layer contains $SiO_2$ and $Si_sO_tN_u$.

* * * * *